(12) United States Patent
Ahn et al.

(10) Patent No.: US 7,105,443 B2
(45) Date of Patent: Sep. 12, 2006

(54) METHOD FOR FABRICATING EPITAXIAL COBALT-DISILICIDE LAYERS USING COBALT-NITRIDE THIN FILM

(75) Inventors: Byung-Tae Ahn, Daejeon (KR); Sun-Il Kim, Jeonrabuk-do (KR); Seung-Ryul Lee, Seoul (KR); Jong-Ho Park, Seoul (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 11/008,671

(22) Filed: Dec. 10, 2004

(65) Prior Publication Data
US 2005/0130417 A1 Jun. 16, 2005

(30) Foreign Application Priority Data
Dec. 16, 2003 (KR) .................... 10-2003-0092079

(51) Int. Cl.
*H01L 21/44* (2006.01)
(52) U.S. Cl. ...................... 438/682; 257/754
(58) Field of Classification Search ........ 438/682–683; 257/754
See application file for complete search history.

(56) References Cited

U.S. PATENT DOCUMENTS 4,814,294 A * 3/1989 West et al. .................. 438/606
5,780,632 A * 7/1998 Saji et al. ..................... 546/15
6,962,873 B1 * 11/2005 Park ............................ 438/627
2003/0124845 A1 * 7/2003 Trivedi ......................... 438/682

OTHER PUBLICATIONS

Rhee, et al., "Epitaxial growth of a (100) $CoSi_2$ layer from carbonic cobalt films deposited on (100) Si substrate using an organomettallic source," *Appl. Phys. Lett.* 74(7): 1003-1005, American Institute of Physics (1999).

Prabhakaran, et al., "Formation of buried epitaxial $CoSi_2$ layer through diffusion mediated reaction," *Applied Surface 117/118*:280-284, Elsevier Science B.V. (1997).

Vantomme, et al., "Concentration-controlled phase selection of silicide formation during reaction deposition," *Appl. Phys. Lett.* 74(21):3137-3139, American Institute of Physics (1999).

Tung, R.T., "Oxide mediated epitaxy of $CoSi_2$ on silicon," *Appl. Phys. Lett.* 68(24):3461-33463 American Institute of Physics (1996).

Lawrence, et al., "Growth of epitaxial $CoSi_2$ on (100)Si," *Appl. Phys. Lett.* 58(12):1308-1310, American Institute of Physics (1991).

(Continued)

*Primary Examiner*—Richard A. Booth
(74) *Attorney, Agent, or Firm*—Sterne, Kessler, Goldstein & Fox P.L.L.C.

(57) ABSTRACT

A method for fabricating epitaxial cobalt disilicide layers uses a cobalt-nitride thin film. Epitaxial cobalt disilicide ($CoSi_2$) layers are fabricated using a cobalt-nitride thin film in a salicide process, wherein a silicide is formed on source/drain regions and a polysilicon gate electrode of a nanoscale MOS transistor. Epitaxial $CoSi_2$ layers can be fabricated on source/drain regions and a gate electrode of a silicon substrate using a cobalt-nitride thin film, without the formation of an interlayer between a cobalt layer and the silicon substrate.

21 Claims, 7 Drawing Sheets

OTHER PUBLICATIONS

Rhee, et al., "Cobalt Metallorganic Chemical Vapor Deposition and Formation of Epitaxial CoSi$_2$ Layer on Si(100) Substrate," *J. electrochem. Soc.* 146(7):2720-2724, The Electrochemical society, Inc. (1999).

Rhee, et al., "Growth behavior and thermal stability of epitaxial CoSi$_2$ layer from cobalt-carbon films on (100) Si substrate," *J. Appl. Phys.* 86(6):3452-3459, American Institute of Physics (1999).

* cited by examiner

US 7,105,443 B2

METHOD FOR FABRICATING EPITAXIAL COBALT-DISILICIDE LAYERS USING COBALT-NITRIDE THIN FILM

CROSS REFERENCE TO RELATED APPLICATIONS

This application claims priority to Korean Patent Application No. 2003-0092079, filed Dec. 16, 2003, which is incorporated herein by reference in its entirety.

BACKGROUND OF THE INVENTION

1. Field of the Invention

The present invention relates to a method for fabricating epitaxial cobalt disilicide ($CoSi_2$) layers using a cobalt-nitride thin film. More particularly, the present invention relates to a method for fabricating epitaxial cobalt disilicide layers using a cobalt-nitride thin film in a salicide process, where the cobalt disilicide is formed on source/drain regions and a polysilicon gate electrode of a nanoscale metal oxide semiconductor (MOS) (i.e. several tens of nanometers in size) transistor used as a constituent element of ultra large-scale integrated (ULSI) circuits, such as Giga Bit DRAMs and Giga Bit flash memories.

2. Background Art $CoSi_2$ is currently used in a salicide process for reducing the contact resistance of source/drain regions and gate electrodes of transistors used in ULSI circuits. Epitaxial $CoSi_2$ layers that match coherently with silicon substrates have generated particular interest due to their low leakage current and superior thermal stability.

Several methods are known for fabricating $CoSi_2$ layers in silicon memory devices. For example, Korean Patent Application Nos. 1993-0021059, 1993-0000616, 1993-0028017 and the like disclose methods for fabricating a $CoSi_2$ layer by depositing cobalt on a silicon substrate using a collimated sputtering process, annealing the cobalt-deposited substrate at a low temperature to form a CoSi layer thereon, removing unconsumed cobalt, followed by annealing at a high temperature to grow CoSi into $CoSi_2$. However, the $CoSi_2$ layer is grown in a polycrystalline phase, in which cobalt is rapidly diffused into the silicon substrate through the grain boundaries, causing a non-uniform interface between the $CoSi_2$ layer and the silicon substrate. This non-uniform interface allows the $CoSi_2$ layer to penetrate inside the pn junction layer of source/drain regions, causing defects and increasing the junction leakage current at the source/drain regions.

To overcome these problems, $CoSi_2$ layers are required to have a uniform thickness. Moreover, with sizes of metal oxide semiconductor field effect transistors (MOSFETs) decreasing to several tens of nanometers, the pn junction depth of source/drain regions becomes thin, down to several tens of nanometers. Accordingly, there is an increasing demand for $CoSi_2$ layers with uniform thicknesses. In order to obtain a uniform thickness of a $CoSi_2$ layer and a smooth interface between $CoSi_2$ layer and silicon substrate, an epitaxial $CoSi_2$ layer is required. To this end, an interlayer is introduced between a cobalt layer and the silicon substrate.

The use of an interlayer interposed between a cobalt layer and a silicon substrate has been reported (see Dass et al., *Growth of Epitaxial CoSi on (100) Si*, Applied Physics Letters, Vol. 58, p. 1308 (1991)). According to the article, during a salicide process of source/drain regions and a polysilicon gate electrode in ultra large integrated circuits with very small MOS transistor dimensions, epitaxial $CoSi_2$ layers are grown on the source/drain regions and the polysilicon gate electrode using titanium (Ti) as the interlayer. This method will be briefly explained below with reference to FIGS. 1A–1E.

FIGS. 1A to 1E are schematic views showing the steps of a conventional art method, wherein an interlayer is formed between a cobalt layer and a silicon substrate in a silicon MOS transistor structure, to grow epitaxial $CoSi_2$ layers. As shown in FIG. 1A, source/drain regions 101A and 101B, a polysilicon gate electrode 103, an insulating layer 120 and an oxide layer or a nitride layer and as a spacer 102, of a MOS transistor, are formed on a silicon substrate 112. In FIG. 1A, reference numeral 111 denotes silicon dioxide films (isolation regions).

As shown in FIG. 1B, an interlayer 106 is formed by depositing titanium using a sputtering process. The titanium interlayer 106 is deposited to a thickness of 20 Å at a room temperature.

As shown in FIG. 1C, a cobalt (Co) layer 104 is deposited on the interlayer, and then a titanium nitride (TiN) capping layer 105 against oxidation of cobalt is deposited thereon. The cobalt layer 104 is deposited to a thickness of about 150 Å on the titanium interlayer 106 by sputtering or vacuum evaporation. The TiN capping layer 105 is deposited on the cobalt layer 104 at a temperature of 200 to 400° C. by a sputtering or reactive vacuum evaporation process.

As shown in FIG. 1D, an epitaxial $CoSi_2$ layer 107 and a polycrystalline $CoSi_2$ layer 110 are grown by annealing at the temperature above 700° C. The capping layer 105 prevents the underlying layer from oxidation upon subsequent annealing.

As shown in FIG. 1E, the TiN capping layer 105, unconsumed cobalt layer 104 and the interlayer 106 (such as the cobalt-titanium alloy layer) are removed.

The resulting structure is subjected to a second annealing at a temperature above 800° C. to grow a silicide having a low contact resistance and a low resistivity.

However, the conventional method, where titanium is used as the interlayer between the cobalt layer and the silicon substrate, has a problem that pinholes are formed at edges of the oxide film during annealing. The pinholes cause an increase in the leakage current of the pn junction and ultimately deteriorate the characteristics of the device. Further, since the method requires a high annealing temperature at above 800° C., a reaction between the silicon oxide film and titanium used as the interlayer takes place. Accordingly, in order to prevent the reaction, a nitride layer having low reactivity with metals must be formed as a spacer between the two layers, rendering the overall processes more complex.

Some methods have been developed using a chemical silicon dioxide film (see R. T. Tung, *Oxide mediated epitaxy of $CoSi_2$ on silicon*, Applied Physics Letters, Vol. 68, p. 3461 (1996)) and germanium (Ge) (see Prabhakaran et al., *Formation of buried epitaxial $CoSi_2$ layer through diffusion mediated reaction*, Applied Surface Science, Vol. 117/118, p. 280 (1997)) as an interlayer, instead of titanium. These methods, however, require additional processes, have difficulties in controlling the thickness of the epitaxial layers, and have poor reproducibility.

Vantomme et al. suggested a theoretical model in which a $CoSi_2$ layer can be epitaxially grown by slow deposition at a low temperature (below 600° C.) using a costly molecular beam epitaxy process (see Applied Physics Letters, Vol. 74, p. 3137 (1999)). However, this model cannot be easily applied to practical use.

Further, a method for growing an epitaxial $CoSi_2$ layer using a cobalt-carbon alloy thin film is described in H. S. Rhee et al., *Epitaxial growth of a (100) $CoSi_2$ layer from carbonic cobalt films deposited on (100) Si substrate using an organometallic source*, Applied Physics Letters, Vol. 74, p. 1003 (1999), and Korean Patent No. 0280102. However, according to this method, since a carbon layer remains on the surface of the epitaxial $CoSi_2$ layer, the complete removal of the carbon layer is difficult.

As explained above, although titanium and oxide films have been used as interlayers, and cobalt-carbon alloy thin films have been used in order to fabricate $CoSi_2$ layers having uniform thickness and a smooth interface, these methods require complex processes for the deposition of the interlayer and have difficulties in the removal of remaining layers.

BRIEF SUMMARY OF THE INVENTION

The present invention has been made in view of the above-mentioned problems associated with the formation of cobalt disilicide. The present invention provides a method for fabricating an epitaxial $CoSi_2$ layer on source/drain regions and a polycrystalline $CoSi_2$ layer on a gate electrode using a cobalt-nitride thin film, without the formation of an interlayer between a cobalt layer and the silicon substrate.

In one aspect of the invention, there is provided a method for fabricating epitaxial cobalt disilicide layers, including forming a cobalt-nitride thin film on a silicon substrate that includes a source region, a drain region, and a gate electrode; forming a capping layer on the cobalt-nitride thin film; and annealing the capping layer and the cobalt-nitride thin film to form a $CoSi_2$ layer on the source and drain regions and the gate electrode. The cobalt-nitride thin film includes about 50 to 95 wt % of cobalt and about 5 to 50 wt % of nitrogen. The cobalt-nitride thin film is formed by reacting a cobalt or an organic cobalt compound with nitrogen or a nitrogen-containing gas. The organic cobalt compound is selected from cobalt carbonyl $[Co_2(CO)_8]$, cobalt acetylacetonate $[Co(CH_3COCHCOCH_3)_2]$, bicyclopentadienylcobalt $[(C_5H_5)_2Co]$, cobalt tricarbonylnitrosyl $[Co(CO)_3NO]$, cyclopentadienylcobalt carbonyl $[C_5H_5Co(CO)_2]$ and tetracobalt dodecacarbonyl $[Co_4(CO)_{12}]$. The nitrogen-containing gas is ammonia ($NH_3$). The reaction occurs at about 300 to 500° C. using a chemical vapor deposition process. The reaction occurs at a temperature up to about 150° C. using a sputtering process. The capping layer is one of a titanium (Ti) and titanium nitride (TiN) layer. The annealing takes place at about 700 to 800° C. A cobalt thin film is deposited, after the formation of the cobalt-nitride thin film, to form a double layer of the cobalt-nitride thin film and the cobalt thin film. A transistor can be fabricated using the method described above.

In another aspect, there is provided a method of forming a transistor, including forming a source and a drain on a substrate; forming an insulating layer on the substrate between the source and the drain; forming a gate electrode over the insulating layer; forming a cobalt-nitride layer on the source, the drain, and the gate electrode; forming a capping layer on the cobalt-nitride layer; and forming a $CoSi_2$ layer on the source, the drain and the gate electrode from the capping layer and the cobalt-nitride layer.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1A:
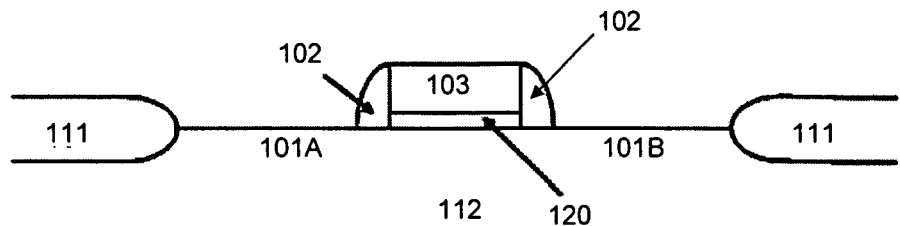
FIGS. 1A to 1E are schematic views showing the conventional method of forming epitaxial $CoSi_2$ layers.
Figure 1B:
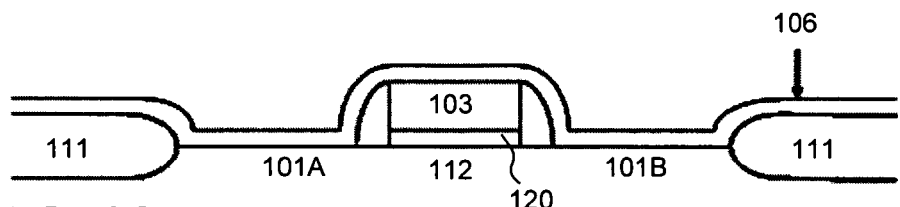
Figure 1C:
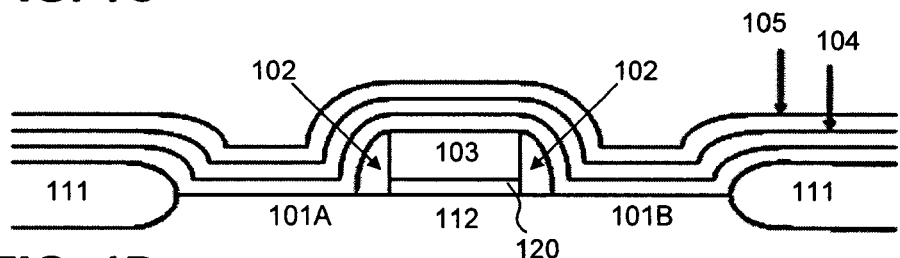
Figure 1D:
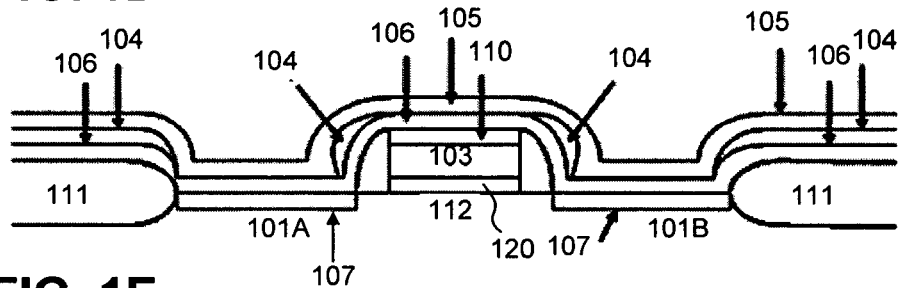
Figure 1E:
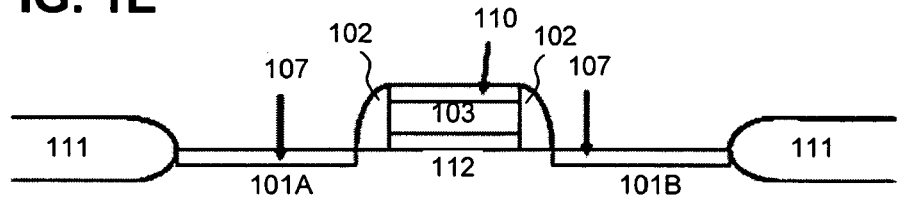
Figure 2A:
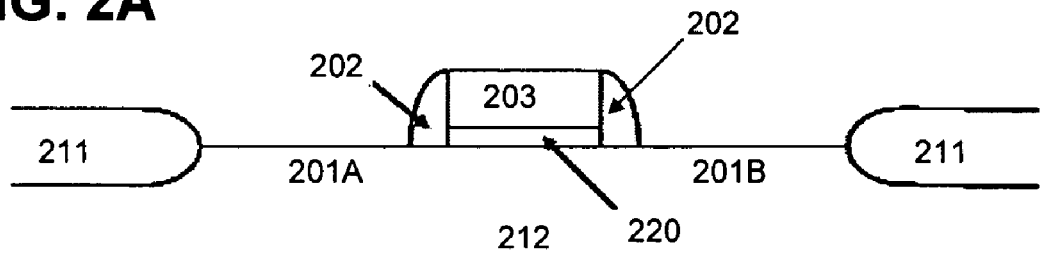
FIGS. 2A to 2E are schematic views showing the method according to the present invention of fabricating epitaxial $CoSi_2$ layers.

FIGS. 2A to 2E are schematic views showing the steps of a method according to the present invention wherein a cobalt-nitride thin film is used in a silicon MOS transistor structure to fabricate epitaxial $CoSi_2$ layers. Specifically, as shown in FIG. 2A, source/drain regions 201A and 201B, an insulation layer 220, a polysilicon gate electrode 203, and a spacer 202 of a MOS transistor are formed.

Figure 2B:
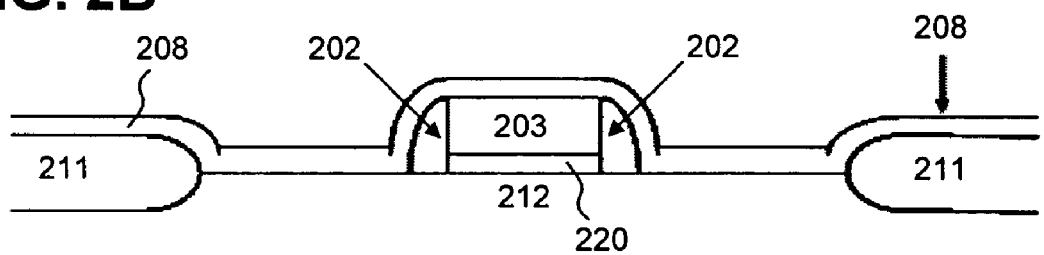

As shown in FIG. 2B, a cobalt-nitride thin film 208 is deposited by chemical vapor deposition or a reactive sputtering process.

Figure 2C:
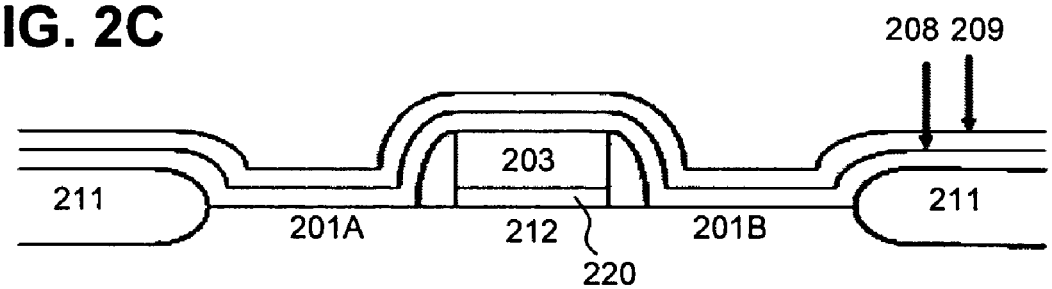

As shown in FIG. 2C, a titanium (Ti) capping layer 209 against oxidation of cobalt is deposited on the cobalt-nitride thin film 208.

Figure 2D:
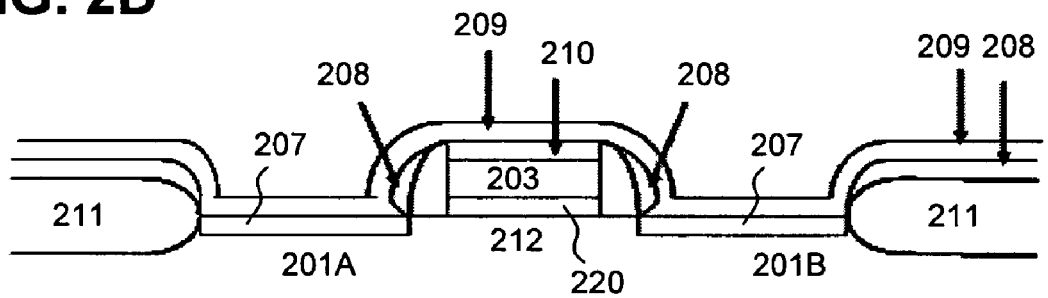
Figure 2E:
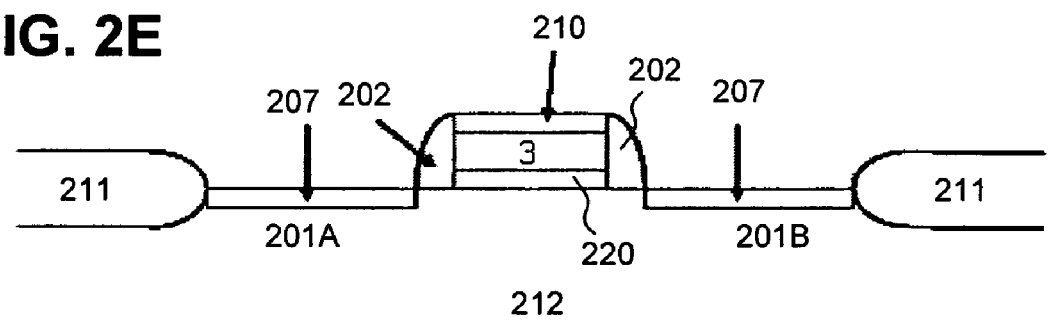

As shown in FIG. 2D, the cobalt supplied from the cobalt-nitride thin film 208 are reacted with silicon at an annealing temperature of 700° C. or higher, to fabricate epitaxial $CoSi_2$ layer 207 at the source/drain regions 201A, 201B and a polycrystalline $CoSi_2$ layer at the gate electrode 210;

As shown in FIG. 2E, the titanium capping layer and unconsumed portions of the cobalt-nitride thin film 208 are removed.

In order to accomplish the present invention, as illustrated in FIGS. 2A to 2E, there is provided a method for fabricating epitaxial cobalt disilicide layers, including:

(1) forming a cobalt-nitride thin film on a silicon substrate, including source/drain regions and a gate electrode;

(2) forming a capping layer against oxidation on the cobalt-nitride thin film; and (3) annealing the resulting structure to fabricate $CoSi_2$ layers on the source/drain regions and the gate electrode.

The cobalt-nitride thin film can be formed on the silicon substrate in such a manner as to have 50 to 95 wt % of cobalt and 5 to 50 wt % of nitrogen. When the cobalt content in the cobalt-nitride thin film is lower than 50%, the presence of a relatively large amount of nitrogen prevents the diffusion of cobalt. Thus, the final $CoSi_2$ layers are seldom fabricated. On the other hand, when the cobalt content exceeds 95%, the nitrogen does not effectively control the diffusion of cobalt, and thus polycrystalline $CoSi_2$ layers are fabricated, instead of the epitaxial $CoSi_2$ layers. The cobalt-nitride thin film is formed by reacting cobalt or an organic cobalt compound with nitrogen or nitrogen containing gas at 300 to 500° C. using a chemical vapor deposition (CVD) or at room temperature using a reactive sputtering process. The cobalt-nitride thin film consisting of 50 to 95 wt % of cobalt and 5 to 50 wt % of nitrogen is formed by reacting cobalt or an organic cobalt compound with nitrogen or a nitrogen-containing gas using a general chemical vapor deposition (CVD) or sputtering process.

The organic cobalt compound used as a cobalt source for the formation of the cobalt-nitride thin film in the present invention can be, but is not limited to, cobalt carbonyl $[Co_2(CO)_8]$, cobalt acetylacetonate $[Co(CH_3COCHCOCH_3)_2]$, bicyclopentadienylcobalt $[(C_5H_5)_2Co]$, cobalt tricarbonylnitrosyl $[Co(CO)_3NO]$, cyclopentadienylcobalt carbonyl $[C_5H_5Co(CO)_2]$ and tetracobalt dodecacarbonyl $[Co_4(CO)_{12}]$.

The nitrogen-containing gas used as a nitrogen source for the formation of the cobalt-nitride thin film in the present invention includes ammonia ($NH_3$).

The forming of the capping layer against oxidation of cobalt can be done by depositing titanium (Ti) or titanium nitride (TiN) on the cobalt-nitride thin film using a general chemical vapor deposition, sputtering or vacuum evaporation process.

When the cobalt-nitride thin film is annealed, the cobalt is diffused into the silicon substrate to fabricate the $CoSi_2$ layers. For example, when the cobalt-nitride thin film is rapidly annealed at a temperature of 700 to 800° C., the cobalt present in the cobalt-nitride thin film and the silicon present in the source/drain regions are reacted to fabricate the $CoSi_2$ layers on the source/drain regions and the gate electrode. The $CoSi_2$ layers fabricated on the source/drain regions have the same orientation as the silicon substrate.

After the formation of the $CoSi_2$ layers on the source/drain regions and the gate electrodes of the silicon substrate by annealing, the titanium capping layer and unconsumed portions of the cobalt-nitride thin film are removed by etching. Any material that can etch the titanium layer and the unconsumed cobalt-nitride thin film can be used as an etchant. Examples of etchants usable in the present invention include, solutions containing distilled water, hydrogen peroxide and ammonia, and solutions containing sulfuric acid and hydrogen peroxide. For example, the etchant usable in the present invention can be a solution of distilled water, hydrogen peroxide and ammonia in a mixing ratio of 5:1:1, or a solution of sulfuric acid and hydrogen peroxide in a mixing ratio of 1:1.

In alternative embodiments of the present invention, cobalt is further deposited on the cobalt-nitride thin film by a chemical vapor deposition or sputtering process to form a double layer of the cobalt-nitride thin film and the cobalt thin film. Thereafter, the double layer is annealed to fabricate $CoSi_2$ layers. The thickness of the $CoSi_2$ layers thus fabricated can be adjusted by controlling the thickness of the cobalt thin film. As an example, a 2 to 3 nm thick cobalt-nitride thin film, a 2 to 6 nm thick cobalt thin film and a titanium capping layer are sequentially deposited on a silicon substrate, followed by annealing at 700 to 800° C. for 1 to 10 minutes, to fabricate 10 to 20 nm thick epitaxial $CoSi_2$ layers on source/drain regions and a gate electrode of the silicon substrate.

The present invention will now be described in more detail with reference to the following examples. However, these examples are given for the purpose of illustration and are not to be construed as limiting the scope of the invention.

EXAMPLE 1

A silicon substrate on which n+ or p+ source/drain regions and polysilicon gate electrode were formed was placed in a reaction chamber. The temperature of the silicon substrate was maintained at 300 to 500° C. Subsequently, ammonia ($NH_3$) gas was fed into the reaction chamber at a rate 20 to 30 sccm (standard cubic centimeters per minute), and then cobalt carbonyl ($Co_2(CO)_8$) stored in a reservoir at 37° C. was transferred to the reactor, to deposit a cobalt-nitride thin film to a thickness of 10 nm on the source/drain regions and the polysilicon gate electrode of the silicon substrate. The deposition was performed by a chemical vapor deposition process in such a manner that the cobalt-nitride thin film had a composition of cobalt and nitrogen in a ratio of 70%:30%.

A titanium capping layer was deposited to a thickness of 10 nm on the cobalt-nitride thin film, followed by rapid annealing at 800° C. for 5 minutes, to grow $CoSi_2$ layers on the source/drain regions and the polysilicon gate electrode.

EXAMPLE 2

A silicon substrate on which n+ or p+ source/drain regions and polysilicon gate electrodes 3 were formed was placed in a reaction chamber. The temperature of the silicon substrate was maintained at 400° C. Subsequently, ammonia ($NH_3$) gas was fed into the reaction chamber at a rate of 30 sccm, and then cobalt carbonyl ($CO_2(CO)_8$) stored in a reservoir at 37° C. was transferred to the reactor to deposit a cobalt-nitride thin film to a thickness of 10 to 12 nm. The deposition was performed at a pressure of 600 to 700 mtorr for 10 minutes by a chemical vapor deposition process.

A titanium capping layer was deposited to a thickness of 10 nm on the cobalt-nitride thin film, followed by rapid annealing at 800° C. for 5 minutes, to grow epitaxial $CoSi_2$ layers on the source/drain regions and the polysilicon gate electrode.

Figure 3:
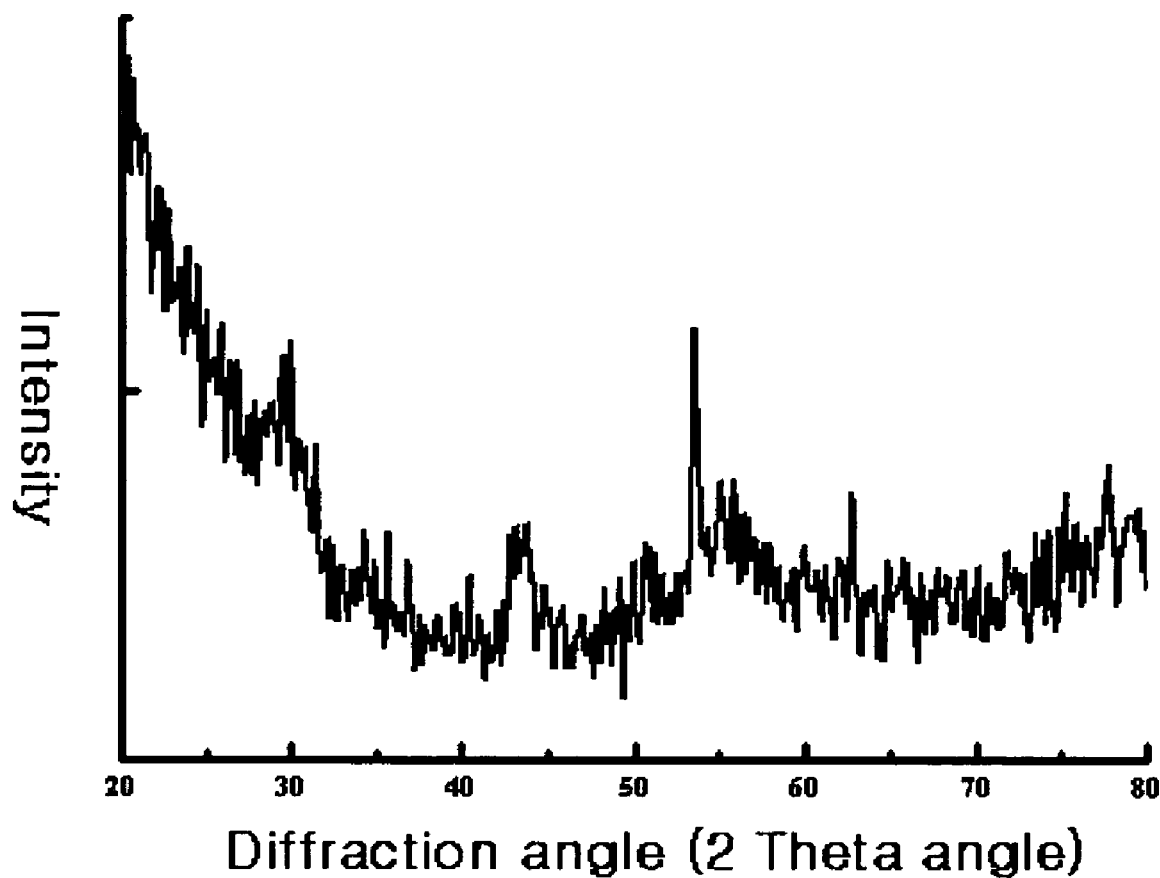
FIG. 3 is a graph showing an X-ray diffraction pattern of a cobalt-nitride thin film deposited on a silicon substrate by reacting cobalt carbonyl ($Co_2(CO)_8$) with ammonia ($NH_3$) at a temperature of 400° C.

X-ray diffraction analysis of the cobalt-nitride thin film deposited on the silicon substrate was performed, and the result is shown in FIG. 3. FIG. 3 is a graph showing an X-ray diffraction pattern of a cobalt-nitride thin film deposited on a silicon substrate by reacting cobalt carbonyl ($Co_2(CO)_8$), an organic cobalt compound, as a cobalt source, with ammonia ($NH_3$) while maintaining the silicon substrate at a temperature of 400° C. As shown in FIG. 3, the pattern is relatively low and flat, indicating that the cobalt-nitride thin film is not completely crystalline.

Figure 4:
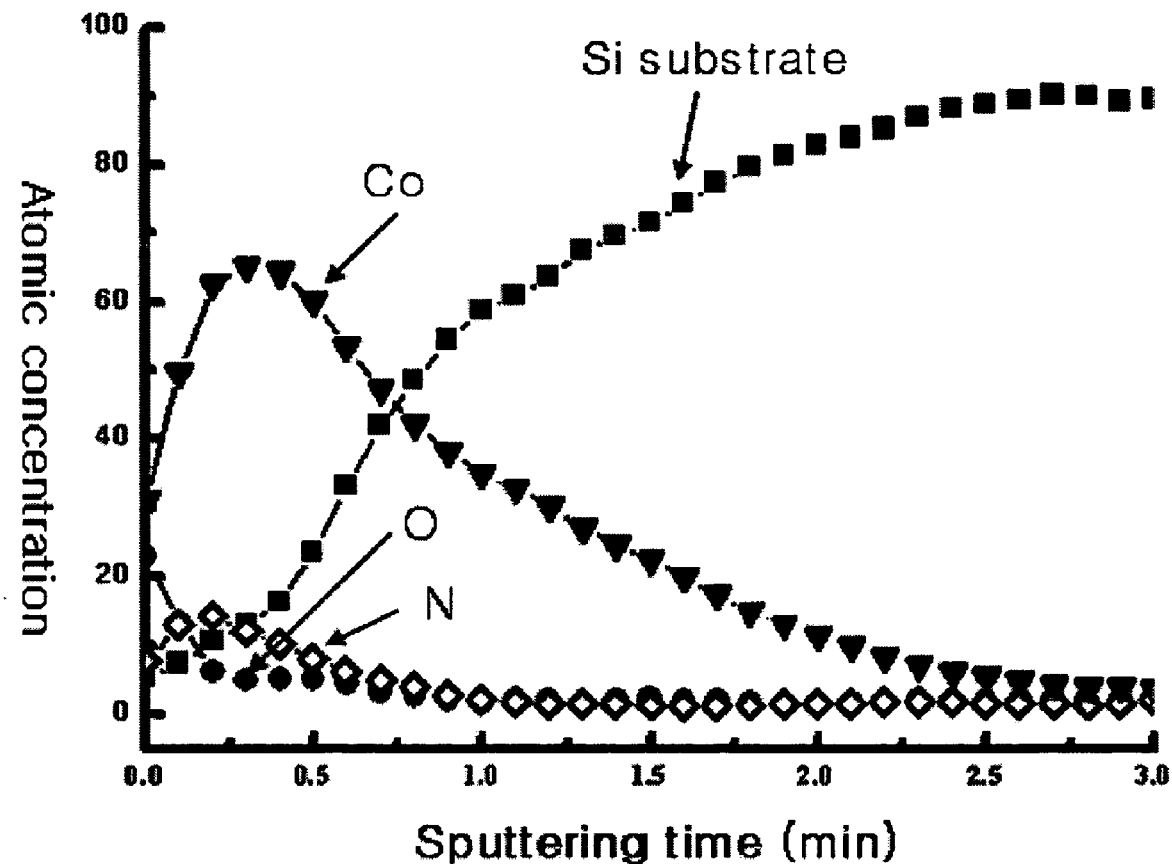
FIG. 4 is a graph showing the composition distribution of the cobalt-nitride thin film of FIG. 3 measured by Auger electron spectroscopy (AES).

The composition of the cobalt-nitride thin film deposited on the silicon substrate was measured using an Auger electron spectrometer, and the results are shown in FIG. 4. In other words, FIG. 4 is a graph showing the composition distribution of the cobalt-nitride thin film of FIG. 3 measured by Auger electron spectroscopy (AES). As can be seen from the spectra, the cobalt-nitride thin film is composed of 70% of cobalt and 30% of nitrogen.

EXAMPLE 3

A silicon substrate on which n+ or p+ source/drain regions and polysilicon gate electrode 3 were formed was placed in a reaction chamber. The temperature of the silicon substrate was maintained at 150° C. or lower, preferably room temperature to about 100° C. and under 4 mtorr. Subsequently, plasma was generated from a mixed gas of argon and nitrogen (3:1) and a cobalt target using a DC power at 200 W to deposit a cobalt-nitride thin film on the silicon substrate. The deposition was performed by a sputtering process in such a manner that the cobalt-nitride thin film had a composition of cobalt and nitrogen in a ratio of 80%:20%. Then, a titanium capping layer was deposited to a thickness of 20 nm on the cobalt-nitride thin film, followed by rapid annealing at 800° C. for 5 minutes, to fabricate epitaxial $CoSi_2$ layers on the silicon substrate.

EXAMPLE 4

A cobalt-nitride thin film was deposited on a silicon substrate in the same manner as in Example 2.

A titanium capping layer was deposited to a thickness of 10 nm on the cobalt-nitride thin film by a sputtering process.

Figure 5:
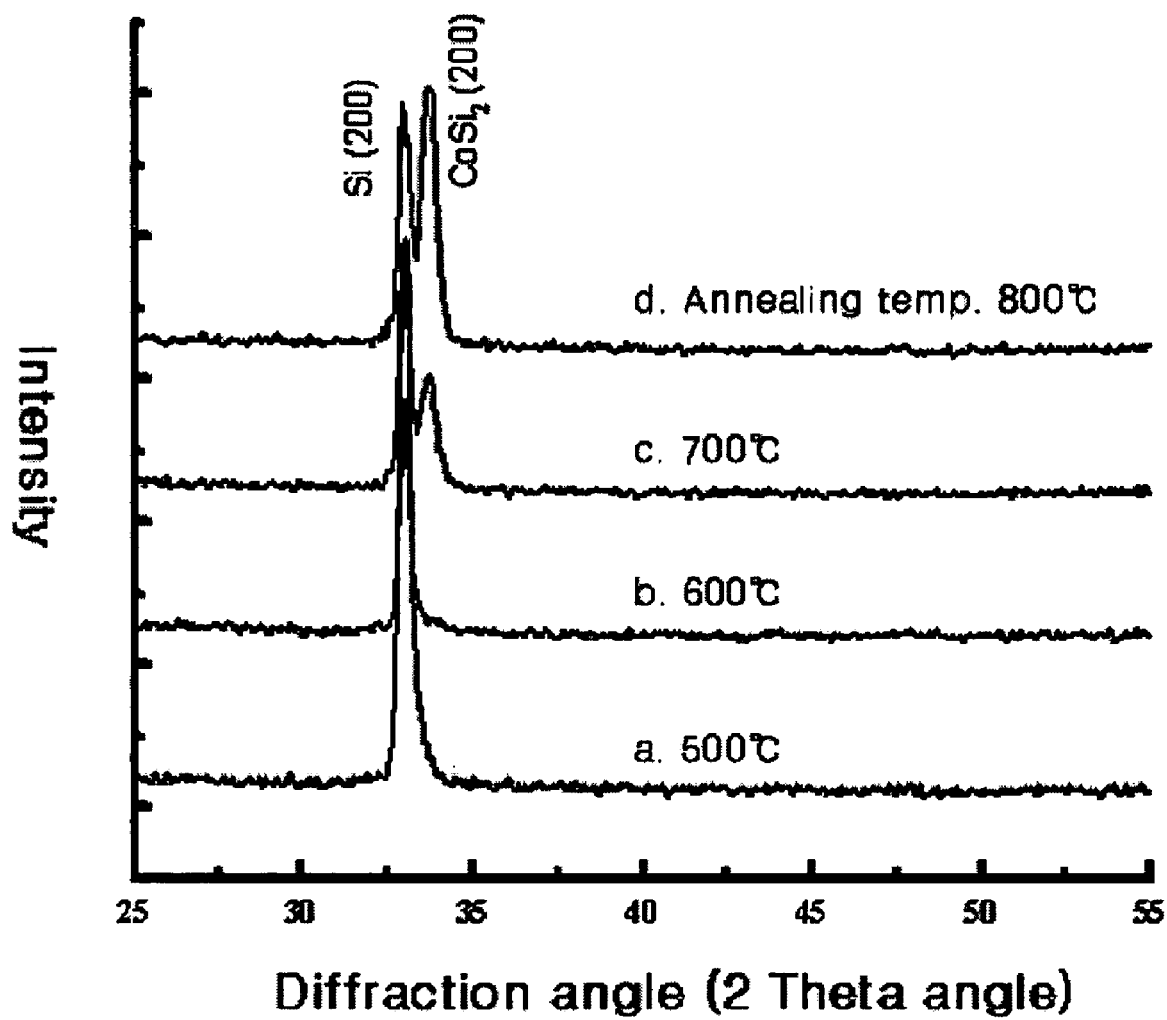
FIG. 5 is a graph showing X-ray diffraction patterns of the silicon substrate on which the titanium capping layer against oxidation is deposited on the cobalt-nitride thin film after annealing at temperatures of 500° C., 600° C., 700° C. and 800° C., respectively.

The resulting structure was rapidly annealed at temperatures ranging from 500 to 800° C. for 5 minutes, respectively. X-ray diffraction analysis of the annealed structure was done at the respective temperatures, and the results are shown in FIG. 5, which shows X-ray diffraction patterns of the silicon substrate on which the titanium capping layer against oxidation is deposited on the cobalt-nitride thin film, followed by annealing at temperatures of 500° C., 600° C., 700° C. and 800° C., respectively. At an annealing temperature of 700° C. or higher, $CoSi_2$ diffraction patterns were observed. As can be seen from FIG. 5, the (200) diffraction peak of the silicon substrate with (100) orientation is identical to that of the $CoSi_2$ layers with (100) orientation. This result indicates that the $CoSi_2$ layers were epitaxially grown.

EXAMPLE 5

A silicon substrate on which n+ or p+ source/drain regions and polysilicon gate electrode were formed was placed in a reaction chamber. The temperature of the silicon substrate was maintained at 450° C. Subsequently, ammonia ($NH_3$) gas was fed into the reaction chamber at a rate 30 sccm, and then cobalt carbonyl ($CO_2(CO)_8$), stored in a reservoir at 37° C. was transferred to the reactor to deposit a cobalt-nitride thin film. The deposition was performed by a chemical vapor deposition process for 10 minutes. The interface microstructure between the cobalt-nitride thin film and the silicon substrate was examined by high resolution transmission electron microscopy (HRTEM) (see FIG. 6).

Figure 6:
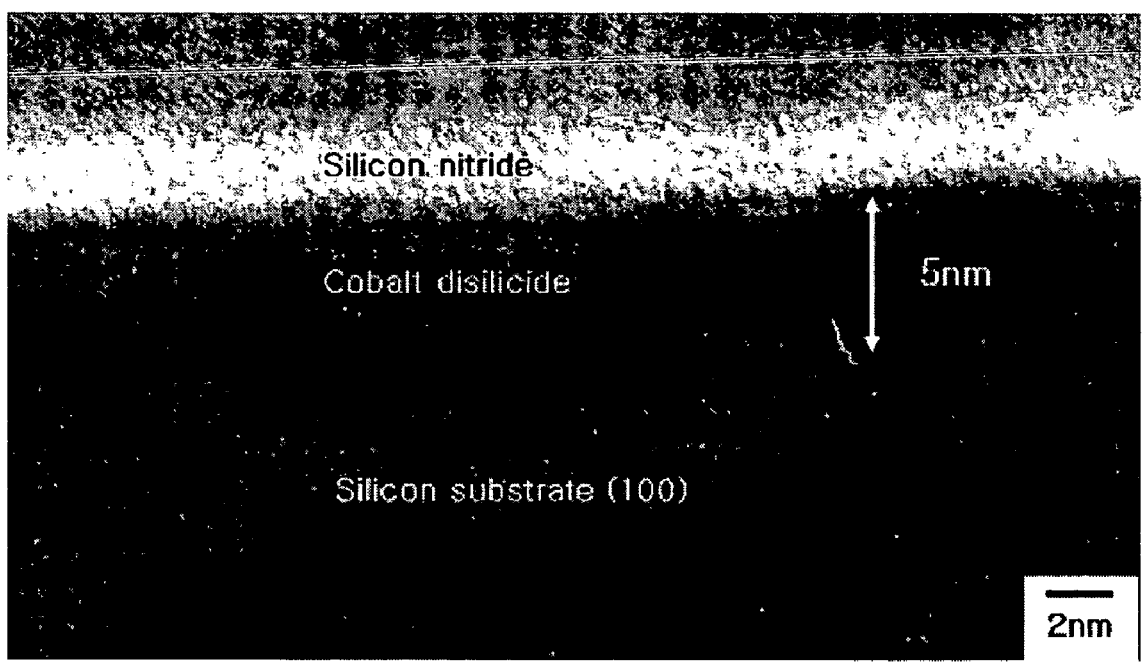
FIG. 6 is a high resolution transmission electron microscope (HRTEM) image showing a cobalt-nitride thin film and cobalt disilicide formed as described in Example 5 of the present invention.

As is evident from FIG. 6, a silicon nitride layer of a thickness of about 3 nm (the white band in FIG. 6) and a cobalt disilicide ($CoSi_2$) with a thickness of about 5 nm were formed at the interface between the cobalt-nitride thin film and the silicon substrate.

Finally, the cobalt-nitride thin film deposited on the silicon substrate was removed by a $H_2SO_4:H_2O_2=1:1$ etchant, followed by annealing at 700° C. for 1 minute, to fabricate the 5 nm thick uniform cobalt disilicide ($CoSi_2$) layers.

EXAMPLE 6

A cobalt-nitride thin film with a thickness of 2 to 3 nm was deposited on a silicon substrate in the same manner as in Example 3, and then a cobalt thin film with a thickness of 5 to 6 nm was deposited in situ thereon by a sputtering process, to form a double layer consisting of the cobalt-nitride thin film and the cobalt thin layer. Then, a 20 nm thick titanium capping layer was deposited on the double layer.

The resulting structure was rapidly annealed at 80° C. for 1 minute to fabricate epitaxial cobalt disilicide layers on the silicon substrate. Using a solution of $H_2SO_4:H_2O_2=1:1$, the titanium layer and unconsumed portions of the cobalt-nitride thin film were removed by etching.

Figure 7:
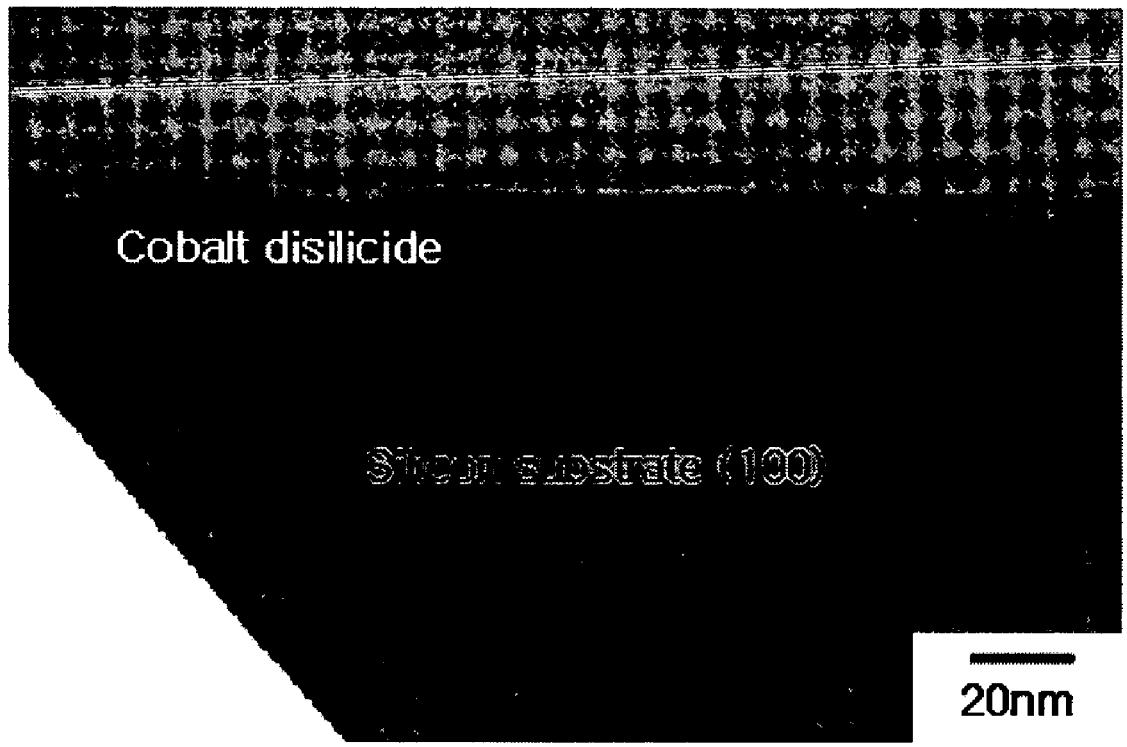
FIG. 7 is a transmission electron microscope (TEM) image of cobalt disilicide formed as described in Example 6 of the present invention.

The micrograph of the silicon substrate on which the epitaxial cobalt disilicide layer was formed was taken using a transmission electron microscope (see FIG. 7). As can be seen in FIG. 7, the epitaxial cobalt disilicide layer fabricated on the silicon substrate was thin (20 nm) and uniform. That is, the use of the double layer of the cobalt-nitride thin film and the cobalt thin film enables the formation of thin (20 nm) and uniform epitaxial cobalt disilicide layers. In addition, by controlling the thickness of the cobalt thin film in the double layer, uniform epitaxial cobalt disilicide layers having a desired thickness can be fabricated.

As apparent from the results of the above examples, uniform epitaxial cobalt disilicide layers can be fabricated on a silicon substrate using a cobalt-nitride thin film. In addition, thin and uniform epitaxial cobalt disilicide layers can be fabricated using a double layer of a cobalt-nitride thin film and a cobalt thin film.

The method according to the present invention has the following advantages:

First, since the method uses a cobalt-nitride thin film, complex deposition steps for the formation of an interlayer are omitted. Accordingly, the overall procedure is simplified, greatly contributing to reduction of semiconductor manufacturing costs.

Second, since the method employs a chemical vapor deposition process, it facilitates the deposition of thin films having superior step coverage, and can be utilized in the manufacture of MOS transistors having several tens of nanometers in size without the use of costly molecular beam epitaxy apparatuses.

Third, cobalt-nitride thin film residues remaining after annealing can be completely removed by simple chemical etching.

Fourth, the use of a double layer of a cobalt-nitride layer and a cobalt layer enables the fabrication of thin (about 5 nm to 40 nm) and uniform $CoSi_2$ layers. Accordingly, leakage current can be reduced at source/drain regions.

Although the above embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating an epitaxial cobalt disilicide layer, comprising:
   forming a cobalt-nitride thin film on a silicon substrate that includes a source region, a drain region, and a gate electrode, wherein the cobalt-nitride thin film includes about 50 to 95 wt % of cobalt;
   forming a capping layer on the cobalt-nitride thin film; and
   annealing the capping layer and the cobalt-nitride thin film to form a $CoSi_2$ layer on the source and drain regions and the gate electrode.

2. The method of claim 1, wherein the cobalt-nitride thin film includes about 5 to 50 wt % of nitrogen.

3. The method of claim 1, wherein the cobalt-nitride thin film is formed by reacting one of cobalt and an organic cobalt compound with one of nitrogen and a nitrogen-containing gas.

4. The method of claim 3, wherein the organic cobalt compound is selected from cobalt carbonyl $[Co_2(CO)_8]$, cobalt acetylacetonate $[Co(CH_3COCHCOCH_3)_2]$, bicyclopentadienylcobalt $[(C_5H_5)_2Co]$, cobalt tricarbonylnitrosyl $[Co(CO)_3NO]$, cyclopentadienylcobalt carbonyl $[C_5H_5Co(CO)_2]$ and tetracobalt dodecacarbonyl $[Co_4(CO)_{12}]$.

5. The method of claim 3, wherein the nitrogen-containing gas is ammonia ($NH_3$).

6. The method of claim 3, wherein the reaction occurs at about 300° C. to 500° C. using a chemical vapor deposition process.

7. The method of claim 3, wherein the reaction occurs at room temperature up to about 150° C. using a sputtering process.

8. The method of claim 1, wherein the capping layer is one of a titanium (Ti) and titanium nitride (TiN) layer.

9. The method of claim 1, wherein the annealing takes place at about 700° C. to 800° C.

10. The method of claim 1, further comprising depositing a cobalt thin film, after the formation of the cobalt-nitride thin film, to form a double layer of the cobalt-nitride thin film and the cobalt thin film.

11. A transistor fabricated by the method of claim 1.

12. A method of forming a transistor, comprising:
    forming a source and a drain on a substrate;
    forming an insulating layer on the substrate between the source and the drain;
    forming a gate electrode over the insulating layer;
    forming a cobalt-nitride layer on the source, the drain, and the gate electrode, wherein the cobalt-nitride layer includes about 50 to 95 wt % of cobalt;
    forming a capping layer on the cobalt-nitride layer; and
    forming a $CoSi_2$ layer on the source, the drain and the gate electrode from the capping layer and the cobalt-nitride layer.

13. The method of claim 12, wherein the cobalt-nitride layer includes about 5 to 50 wt % of nitrogen.

14. The method of claim 12, wherein the cobalt-nitride layer is formed by reacting one of cobalt and an organic cobalt compound with one of nitrogen and a nitrogen-containing gas.

15. The method of claim 14, wherein the organic cobalt compound is selected from cobalt carbonyl $[Co_2(CO)_8]$, cobalt acetylacetonate $[Co(CH_3COCHCOCH_3)_2]$, bicyclopentadienylcobalt $[(C_5H_5)_2Co]$, cobalt tricarbonylnitrosyl $[Co(CO)_3NO]$, cyclopentadienylcobalt carbonyl $[C_5H_5Co(CO)_2]$ and tetracobalt dodecacarbonyl $[Co_4(CO)_{12}]$.

16. The method of claim 14, wherein the nitrogen-containing gas is ammonia ($NH_3$).

17. The method of claim 14, wherein the reacting occurs at about 300° C. to 500° C. using a chemical vapor deposition process.

18. The method of claim 14, wherein the reacting occurs at room temperature up to about 150° C. using a sputtering process.

19. The method of claim 12, wherein the capping layer is one of a titanium (Ti) and titanium nitride (TiN) layer.

20. The method of claim 12, wherein forming a $CoSi_2$ layer comprises annealing the capping layer and the cobalt-nitride layer at about 700° C. to 800° C.

21. The method of claim 12, further comprising depositing a cobalt layer, after the formation of the cobalt-nitride layer, to form a double layer of the cobalt-nitride thin film and the cobalt thin film.

* * * * *